US008575674B2

(12) United States Patent
Sukegawa et al.

(10) Patent No.: US 8,575,674 B2
(45) Date of Patent: Nov. 5, 2013

(54) FERROMAGNETIC TUNNEL JUNCTION STRUCTURE, AND MAGNETO-RESISTIVE ELEMENT AND SPINTRONICS DEVICE EACH USING SAME

(75) Inventors: Hiroaki Sukegawa, Ibaraki (JP); Koichiro Inomata, Ibaraki (JP); Rong Shan, Ibaraki (JP); Masaya Kodzuka, Ibaraki (JP); Kazuhiro Hono, Ibaraki (JP); Takao Furubayashi, Ibaraki (JP); Wenhong Wang, Ibaraki (JP)

(73) Assignee: National Institute for Materials Science, Ibaraki (JP)

(*) Notice: Subject to any disclaimer, the term of this patent is extended or adjusted under 35 U.S.C. 154(b) by 0 days.

(21) Appl. No.: 13/264,460

(22) PCT Filed: Apr. 15, 2010

(86) PCT No.: PCT/JP2010/056785
§ 371 (c)(1),
(2), (4) Date: Dec. 19, 2001

(87) PCT Pub. No.: WO2010/119928
PCT Pub. Date: Oct. 21, 2010

(65) Prior Publication Data
US 2012/0091548 A1    Apr. 19, 2012

(30) Foreign Application Priority Data
Apr. 16, 2009  (JP) ................. 2009-099483

(51) Int. Cl.
*H01L 29/76*   (2006.01)
(52) U.S. Cl.
USPC ........ 257/314; 438/3; 257/421; 257/E29.042; 257/E29.179
(58) Field of Classification Search
USPC ............... 257/421, 314, E29.179, E29.042
See application file for complete search history.

(56) References Cited

U.S. PATENT DOCUMENTS

2002/0054462 A1* 5/2002 Sun et al. ............. 360/324.2
2008/0278864 A1* 11/2008 Zhang et al. ......... 360/324.12

FOREIGN PATENT DOCUMENTS

JP    2001-332781      11/2001
JP    2003-229614       8/2003
WO    WO 2006003639 A1 * 1/2006

OTHER PUBLICATIONS

Authors: T. M. Nakatani1, A. Rajanikanth1, Z. Gercsi2, Y. K. Takahashi2, K. Inomata2, and K. Hono2 Title: Structure, magnetic property and spin polarization of Co2FeAlxSi1-x Heusler alloys Date of Publish: Aug. 8, 2007 Journal of Applied Physics, vol. 102, Issue 3, pp. 8.*

(Continued)

*Primary Examiner* — N Drew Richards
*Assistant Examiner* — Ratisha Mehta
(74) *Attorney, Agent, or Firm* — Wenderoth, Lind & Ponack, L.L.P.

(57) ABSTRACT

Disclosed is a ferromagnetic tunnel junction structure which is characterized by having a tunnel barrier layer that comprises a non-magnetic material having a spinel structure. The ferromagnetic tunnel junction structure is also characterized in that the non-magnetic material is substantially $MgAl_2O_4$. The ferromagnetic tunnel junction is also characterized in that at least one of the ferromagnetic layers comprises a Co-based full Heusler alloy having an $L2_1$ or B2 structure. The ferromagnetic tunnel junction structure is also characterized in that the Co-based full Heusler alloy comprises a substance represented by the following formula: $Co_2FeAl_xSi_{1-x}$ ($0 \leq x \leq 1$). Also disclosed are a magnetoresistive element and a spintronics device, each of which utilizes the ferromagnetic tunnel junction structure and can achieve a high TMR value, that cannot be achieved by employing conventional tunnel barrier layers other than a MgO barrier.

14 Claims, 5 Drawing Sheets

(56) References Cited

OTHER PUBLICATIONS

International Search Report issued Jul. 20, 2010 in International (PCT) Application No. PCT/JP2010/056785 of which the present application is the national stage.

Y. Sakuraba et al., "Huge Spin-Polarization of $L2_1$-Ordered $Co_2MnSi$ Epitaxial Heusler Alloy Film", Japanese Journal of Applied Physics, vol. 44, No. 35, 2005, pp. L1100-L1102.

* cited by examiner

FERROMAGNETIC TUNNEL JUNCTION STRUCTURE, AND MAGNETO-RESISTIVE ELEMENT AND SPINTRONICS DEVICE EACH USING SAME

This application is a US National Stage of International Application No. PCT/JP2010/056785 filed Apr. 15, 2010.

TECHNICAL FIELD

The present invention relates to a ferromagnetic tunnel junction structure comprising a structure having a tunnel barrier layer disposed between two ferromagnetic layers and a magnetoresistive element using the same and the application to a spintronics device.

BACKGROUND ART

In recent years, a Giant Magnetoresistance (GMR) effect element comprising a multilayer film of a ferromagnetic layer/non-magnetic metal layer and a ferromagnetic tunnel junction (MTJ) comprising a ferromagnetic layer/insulator layer/ferromagnetic layer have attracted attention as new magnetic field sensor and non-volatile magnetic random access memory (MRAM) cell. With respect to the GMR, there have been known a CIP-GMR of a type such that an electric current flows within the plane of the film and a CPP-GMR of a type such that an electric current flows in the direction perpendicular to the plane of the film. The principle of the GMR resides mainly in spin-dependent scattering at the interface between the magnetic layer and the non-magnetic layer, but spin-dependent scattering in the magnetic material (bulk scattering) also contributes to the principle.

For this reason, generally, the CPP-GMR to which the bulk scattering is expected to contribute is larger than the CIP-GMR. There is used a GMR element of a spin valve type in which an antiferromagnetic layer is disposed in the vicinity of one of the ferromagnetic layers to fix the spin of the ferromagnetic layer.

On the other hand, in the MTJ, by controlling the magnetization configurations of two ferromagnetic layers to be parallel or antiparallel to each other using an external magnetic field, a so-called tunnel magnetoresistance (TMR) effect in which the tunnel currents in the direction perpendicular to the planes of the films are different from each other can be obtained at room temperature. The TMR ratio in the tunnel junction depends on a spin polarization P at the interface between the ferromagnetic material and insulator used, and it is known that when spin polarizations of two ferromagnetic materials are respectively taken as $P_1$ and $P_2$, a TMR ratio is generally given by the following formula (1).

$$TMR = 2P_1P_2/(1-P_1P_2) \qquad (1)$$

A ferromagnetic material has a spin polarization P which satisfies the relationship: $0 < P \le 1$. Conventionally, an Al oxide film (AlOx) having an amorphous structure and a (001) plane-oriented MgO film have been used as a barrier. The former is prepared by forming a film of Al metal by a sputtering method or the like and then oxidizing the resultant film by a plasma oxidation method or the like, and it has been well known that the Al oxide film has an amorphous structure (non-patent document 1). On the other hand, as a method for preparing the MgO barrier, a method is used in which a MgO target is directly sputtered or a MgO shot is evaporated using an electron beam.

As can be seen from the formula (1), when using a ferromagnetic material having a spin polarization P=1, an infinitely large TMR is expected. A magnetic material having P=1 is called a half-metal, and from the band calculations already made, oxides, such as $Fe_3O_4$, $CrO_2$, $(La-Sr)MnO_3$, $Th_2MnO_7$, and $Sr_2FeMoO_6$, half Heusler alloys, such as NiMnSb, full Heusler alloys having an $L2_1$ structure, such as $Co_2MnGe$, $Co_2MnSi$, and $Co_2CrAl$, and the like are known as half-metals.

The MTJ has currently been practically used in a magnetic read head for hard disk and a non-volatile magnetic random access memory MRAM. In the MRAM, MTJ are arranged in a matrix form and an electric current is allowed to flow a separately provided wiring to apply a magnetic field to the MTJ, so that two magnetic layers constituting each MTJ are controlled to be parallel or antiparallel to one another, thus recording data of 1 or 0. The recorded data is read utilizing a TMR effect. In such a field of application that needs high-speed operation, an MTJ having a small resistance is demanded. In addition, recently, magnetization switching of an MTJ by injection of a spin polarization current, i.e., so-called spin-transfer magnetization switching is important, and an MTJ having a small resistance is needed therefor. Further, a technique for spin injection into a semiconductor through a barrier is increasingly important in the fields of spin MOSFET and spin transistor. Also in these fields, a barrier having a small resistance is required for gaining a larger on-current.

In this situation, the conventional AlOx amorphous barrier has disadvantages in that the junction resistance is too high, that the interface roughness between the ferromagnetic layer and the barrier layer is marked such that the properties become remarkably uneven, and that the TMR is generally small, and therefore the AlOx amorphous barrier is not suitable for the above-mentioned spintronics device. On the other hand, with respect to the epitaxial tunnel junction using a crystalline MgO barrier, it has been known that the tunnel junction has a large tunnel transmission of a $\Delta_1$ band electron with respect to a ferromagnetic layer material having a bcc crystalline structure, such as Fe or FeCo alloys, due to the feature of the electronic structure of the MgO, and therefore has a small tunnel resistance, and further the TMR is largely enhanced due to the coherent tunnel effect (non-patent document 2).

A Co-based full Heusler alloy is an intermetallic compound having a $Co_2YZ$ type composition, and it is known that the Co-based full Heusler alloy having an $L2_1$ structure or a B2 structure is generally a half-metal. In such a compound, for obtaining an ordered structure, heat treatment is required, and for obtaining a B2 structure, it is generally necessary to heat the substrate at 300° C. or higher or to form a film at room temperature and then subject the resultant film to heat treatment at a temperature of 400° C. or higher. For obtaining an $L2_1$ structure, heat treatment at a temperature higher than that required for obtaining the B2 structure is needed. Conventionally, an MTJ using a Co-based full Heusler alloy is prepared using Cr or MgO as a buffer layer on a MgO (001) single crystal substrate and using MgO or amorphous AlOx as a barrier. A MgO barrier is epitaxial-grown on a Co-based Heusler alloy film, and a Co-based full Heusler alloy is also epitaxial-grown on the MgO barrier, so that a B2 or $L2_1$ structure can be relatively easily obtained.

The inventors of this application have proposed a $Co_2FeAl_xSi_{1-x}$ (0<x<1) half-metal Heusler alloy having a controlled Fermi level (patent document 1), and have reported a large TMR at room temperature (non-patent document 3).

It has been pointed out theoretically that the coherent tunnel effect is effective in the Co-based full Heusler alloy (non-patent document 4). However, when the Co-based full Heusler alloy is used as a material for the ferromagnetic layer, the lattice mismatch between the alloy and MgO is large such that many defects, such as dislocation, are caused in the MgO barrier, making it difficult to obtain a high-quality tunnel junction. Particularly, the structure of the Co-based full Heusler alloy on the MgO barrier is likely to be a disordered structure, so that a giant TMR expected from a half-metal is not observed. Further, the momentum in the direction perpendicular to the plane of the film is not conserved due to the formation of disordered structure at the interface, and the enhancement of TMR by the coherent tunnel effect pointed out by the theory is not always observed. On the other hand, the AlOx barrier having an amorphous structure has a problem in that the Co-based full Heusler alloy formed on the AlOx barrier is unlikely to have a B2 or $L2_1$ structure, and generally has an A2 structure and hence loses properties of half-metal, making it difficult to obtain a large TMR. In addition, a difficulty of reducing the large junction resistance must be overcome. Further, there is also a problem in that the interface between the Co-based Heusler alloy layer and the AlOx barrier is oxidized when the AlOx barrier is formed.

Recording or reading data using an MTJ needs the application of a bias voltage of several hundred mV to about 1 V. However, the MTJ having an amorphous AlOx barrier or a MgO barrier has a problem in that generally the application of a bias voltage of about 500 mV reduces the TMR value to half of the value at zero bias voltage. The large dependence of the TMR value on the bias voltage is caused mainly by the lattice defect or interface roughness between the ferromagnetic layer and the barrier layer, and therefore in the MTJ having a conventional amorphous AlOx barrier or MgO having large lattice misfit, it is extremely difficult to improve the TMR dependence on the bias voltage.

PRIOR ART DOCUMENTS

Patent Document

PATENT DOCUMENT 1: WO 2007/126071

Non-Patent Documents

NON-PATENT DOCUMENT 1: J. S. Moodera et al., Phys. Rev. Lett. 74, 3273 (1995)
NON-PATENT DOCUMENT 2: W. H. Butler et al., Phys. Rev. B 63, 054416 (2001)
NON-PATENT DOCUMENT 3: N. Tezuka et al., Jpn. J. Appl. Phys. 46, L454 (2007)
NON-PATENT DOCUMENT 4: Miura et al., J. Phys.: Condens. Matter 19, 365228 (2007)

SUMMARY OF THE INVENTION

Problems that the Invention is to Solve

Accordingly, an object of the present invention is to attain a high TMR value, which has not conventionally been attained, using a tunnel barrier layer other than the MgO barrier, and to attain reduction of the dependence of the TMR value on the bias voltage.

Means for Solving the Problems

The inventors of this application have made studies on the MTJ using an AlOx barrier, and have found during the studies that an oxide film prepared from an alloy of Al and Mg undergoes crystallization to form a $MgAl_2O_4$ spinel structure.

As a result, it has been found that the resistance of the tunnel junction falls by more than one orders of that obtained when using an amorphous AlOx barrier or less and further a larger TMR can be obtained, and that an epitaxial tunnel junction having small lattice misfit especially with a Co-based full Heusler alloy or a CoFe alloy, and having reduced defects and excellent lattice matching, as compared to the tunnel junction using a MgO barrier, can be obtained, and the like, and the inventors of this application have accomplished the present invention based on this novel finding.

Further, it has also been found that by a method in which heat treatment in a vacuum is performed after forming the $MgAl_2O_4$ barrier, the structure at the barrier interface is improved, so that the dependence of the TMR value on the bias voltage is remarkably improved. The invention has been made also based on this finding.

Specifically, the ferromagnetic tunnel junction structure of the invention 1 is characterized in that a tunnel barrier layer comprises a non-magnetic material having a spinel structure.

The invention 2 is the ferromagnetic tunnel junction structure of the invention 1, characterized in that the non-magnetic substance is substantially $MgAl_2O_4$. The term "substantially" means that the non-magnetic material may have a composition which is not exactly $MgAl_2O_4$ or which lacks oxygen or contains excess oxygen as long as the non-magnetic substance has a spinel structure.

The invention 3 is the ferromagnetic tunnel junction structure of the invention 1 or 2, characterized in that at least one of the ferromagnetic layers comprises a Co-based full Heusler alloy having an $L2_1$ or B2 structure.

The invention 4 is the ferromagnetic tunnel junction structure of the invention 3, characterized in that the Co-based full Heusler alloy comprises $Co_2FeAl_xSi_{1-x}$ ($0 \leq x \leq 1$).

The magnetoresistive element of the invention 5 is characterized in that the ferromagnetic tunnel junction is the ferromagnetic tunnel junction structure of any one of the inventions 1 to 4.

The spintronics device of the invention 6 is characterized in that the ferromagnetic tunnel junction used in the device is the ferromagnetic tunnel junction structure of any one of the inventions 1 to 4.

Effect of the Invention

In the invention, a resistance even smaller than that obtained when using an amorphous AlOx barrier and a larger TMR can be obtained. In addition, a tunnel barrier and a tunnel junction having higher quality than that obtained when using a MgO barrier can be obtained by a sputtering method. Further, it is possible to keep the TMR value higher even during the application of a bias voltage.

Furthermore, it has also been found that by a method in which heat treatment in a vacuum is performed after forming the $MgAl_2O_4$ barrier, the structure of the barrier interface is improved, so that the dependence of the TMR value on the bias voltage is remarkably improved. Accordingly, the tunnel junction of the invention can be applied to a magnetic head for HDD and an MRAM, and further can be utilized in a variety of spintronics devices which require the application of a bias voltage, and the like, spin logic devices, such as a spin resonant-tunneling device having a ferromagnetic double tunnel junction, and a spin MOSFET which needs efficient spin injection into a semiconductor. Especially in the application to a spin MOSFET, when a magnetic layer is stacked on a Si substrate through a tunnel barrier, by using as a barrier a non-magnetic substance having a spinel structure in the invention, such as $MgAl_2O_4$, a magnetic layer having less lattice stress can be grown, enabling efficient spin injection from the magnetic layer into Si.

MODE FOR CARRYING OUT THE INVENTION

As mentioned above, the inventors of this application have found that when a thin Mg film and Al film are stacked on a lower magnetic layer using a magnetron sputtering apparatus and subjected to plasma oxidation treatment under appropriate conditions, a $MgAl_2O_4$ spinel structure can be obtained, and that when a $MgAl_2$ alloy is first sputtered and then subjected to plasma oxidation, a $MgAl_2O_4$ spinel structure can be obtained. Further, they have found that by appropriately selecting a material for the ferromagnetic layer, it is possible to prepare an MTJ in which a lower magnetic layer, a $MgAl_2O_4$ spinel barrier layer, and an upper magnetic layer are grown epitaxially. In the present invention based on the above finding, with respect to the material constituting the barrier layer having a spinel structure, any non-magnetic material of a spinel structure may be used, and $MgAl_2O_4$, $ZnAl_2O_4$, $MgCr_2O_4$, $MgMn_2O_4$, $CuCr_2O_4$, $NiCr_2O_4$, $GeMg_2O_4$, $SnMg_2O_4$, $TiMg_2O_4$, $SiMg_2O_4$, $CuAl_2O_4$, $Li_{0.5}Al_{2.5}O_4$, $\gamma$-$Al_2O_3$ (cubic alumina), or the like can be used.

With respect to the lower magnetic layer and upper magnetic layer, any material having excellent lattice matching with the barrier layer can achieve the effect aimed at by the invention.

Specifically, it is desired that the lattice misfit is 10% or less, preferably 5% or less, more preferably 3% or less. When $MgAl_2O_4$ is used as the barrier layer, a Co-based full Heusler alloy, a bcc CoFe alloy, or the like can be used.

A material on which a (001)-oriented epitaxial tunnel junction can be formed may be used, and, for example, MgO, spinel $MgAl_2O_4$ single crystal, Si, or GaAs is preferably used.

If necessary, a buffer layer comprising a non-magnetic spinel, Cr, or MgO is formed on the substrate.

Alternatively, thermally oxidized Si can be used as a substrate. In this case, a MgO target is sputtered under conditions for film formation such that the Ar gas pressure, sputtering power, or the like is controlled to permit a (001)-oriented MgO film to grow, making it possible to form a (001)-oriented epitaxial tunnel junction.

Then, a lower magnetic layer, a barrier layer, and an upper magnetic layer are formed thereon successively, for example, as follows.

A full Heusler alloy constituting a lower magnetic layer, for example, a $Co_2FeAl_{0.5}Si_{0.5}$ (hereinafter, referred to as "CFAS") thin film is formed.

Then, the formed film is subjected to in situ heat treatment at a temperature of about 400 to 600° C., obtaining a CFAS film having a B2 or $L2_1$ structure. In this case, a B2 structure is obtained in the treatment at 500° C. or lower, and an $L2_1$ structure is obtained in the treatment at a temperature in the range of from 540 to 600° C.

Next, when a $MgAl_2O_4$ oxide film is employed as a barrier layer, a thin Mg film and Al film are continuously formed on the lower magnetic layer (CFAS film). Alternatively, a $MgAl_2$ target may be prepared and deposited by sputtering. Then, oxygen is introduced and the resultant film is subjected to plasma oxidation treatment to form a $MgAl_2O_4$ oxide film of a spinel structure as a barrier layer.

The amount of oxygen does not necessarily satisfy the stoichiometric composition, and the barrier layer may lack oxygen or contain excess oxygen, and further Mg and Al may not necessarily satisfy the 1:2 relationship as long as the barrier layer is substantially of a spinel structure.

Next, a $Co_{75}Fe_{25}$ alloy (hereinafter, referred to as "CoFe alloy") is sputtered on the tunnel barrier layer to obtain a (001)-oriented CoFe alloy film as an upper magnetic layer.

Thus, a collectively (001)-oriented epitaxial tunnel junction can be prepared.

When using a Co-based half-metal full Heusler alloy instead of the CoFe alloy, a larger TMR can be obtained.

As a method for forming a film, a sputtering method, or a general method for forming a thin film, such as a vapor deposition method, a laser ablation method, or an MBE method, can be used.

Hereinbelow, Examples of the present invention will be described.

Example 1

Using a DC magnetron sputtering apparatus and using a Cr film as a buffer layer, a Cr (40 nm)/$Co_2FeAl_{0.5}Si_{0.5}$ (80 nm) stacked film was formed on a MgO (001) substrate. Then, for improving the $Co_2FeAl_{0.5}Si_{0.5}$ (CFAS) film in crystalline properties, the stacked film was subjected to heat treatment at a temperature of 430° C. for one hour. The X-ray diffraction has revealed that the CFAS in this state is of a B2 structure. Subsequently, Mg and Al targets were sputtered to form a Mg (0.7 nm)/Al (1.3 nm) stacked film, and the resultant substrate was transferred to an oxidation chamber. Ar and oxygen were introduced into the oxidation chamber and the stacked film was subjected to inductively coupled plasma (ICP) oxidation treatment to form a Mg—Al oxide film. In this instance, the Ar:oxygen partial pressure ratio was 3:17, and the oxidation time was 120 seconds.

The resultant stacked film was transferred again to the film formation chamber, and subsequently, a CoFe (3 nm)/IrMn (12 nm)/Ru (7 nm) stacked film was formed at room temperature, preparing a spin valve type tunnel junction. The figure in parentheses indicates a thickness of each film. The Mg—Al oxide film is a tunnel barrier layer, and CoFe is an upper magnetic layer. IrMn is an antiferromagnetic material and have a role in fixing the spin direction of CoFe. Ru is a protective film and further serves as a mask in the microfabrication.

Next, while applying a magnetic field of 5 kOe, the whole of the stacked film was subjected to heat treatment at a temperature of 250° C. to add uniaxial anisotropy to the upper magnetic CoFe layer. Then, the stacked film was processed into a size of 10 μm×10 μm by microfabrication using photolithography and ion milling. An external magnetic field was applied to the resultant element to measure the change of a magnetic resistance at different temperatures.

Figure 1:
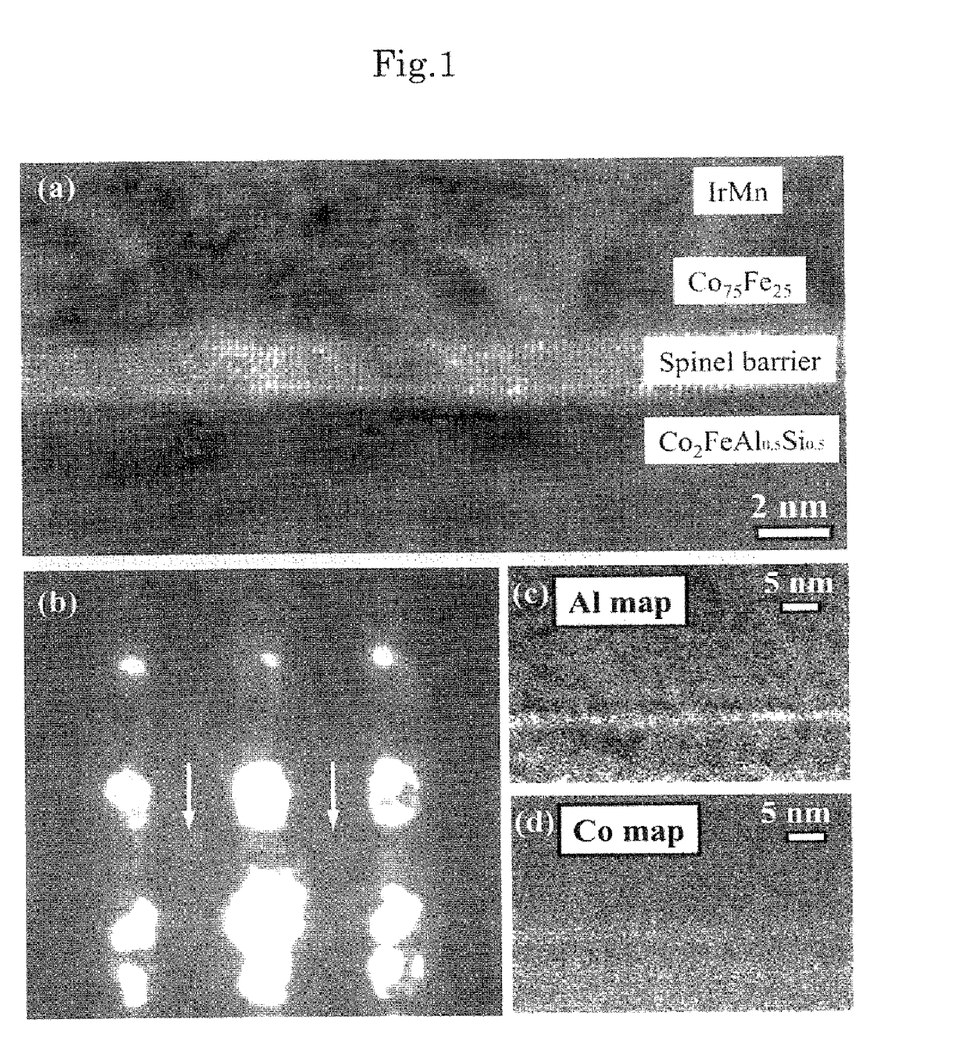
FIG. 1 shows results of the analysis by a cross-sectional TEM image of the tunnel junction of the invention using a $Co_2FeAl_{0.5}Si_{0.5}$ (CFAS) Heusler electrode and a tunnel barrier. (a) is a cross-sectional TEM image, (b) is nanobeam diffraction image in the barrier layer, in which arrows indicate the structure characteristic of spinel, (c) is an Al elemental map image obtained by electron energy loss spectroscopy (EELS), and (d) is a Co elemental map image.

FIG. 1 shows the results of the examination under a transmission electron microscope of the cross-sectional structure of the above-obtained stacked film. From FIG. 1(a), it is found that the tunnel barrier is a crystalline layer. The analysis of the structure of the barrier layer by electron diffraction has revealed that the barrier layer is of a spinel structure, and it has been found that the barrier substantially comprises $MgAl_2O_4$ {FIG. 1(b)}. Further, examination by electron energy loss spectroscopy (EELS) was made with respect to the region of FIG. 1(a). From the Al map image of FIG. 1(c) and the Co map image of FIG. 1(d), it has been found that Al is contained in the tunnel barrier and forms a homogeneous layer. On the other hand, it has also been found that the lower CFAS layer is of a B2 structure, which is consistent with the result of the X-ray diffraction.

Figure 2:
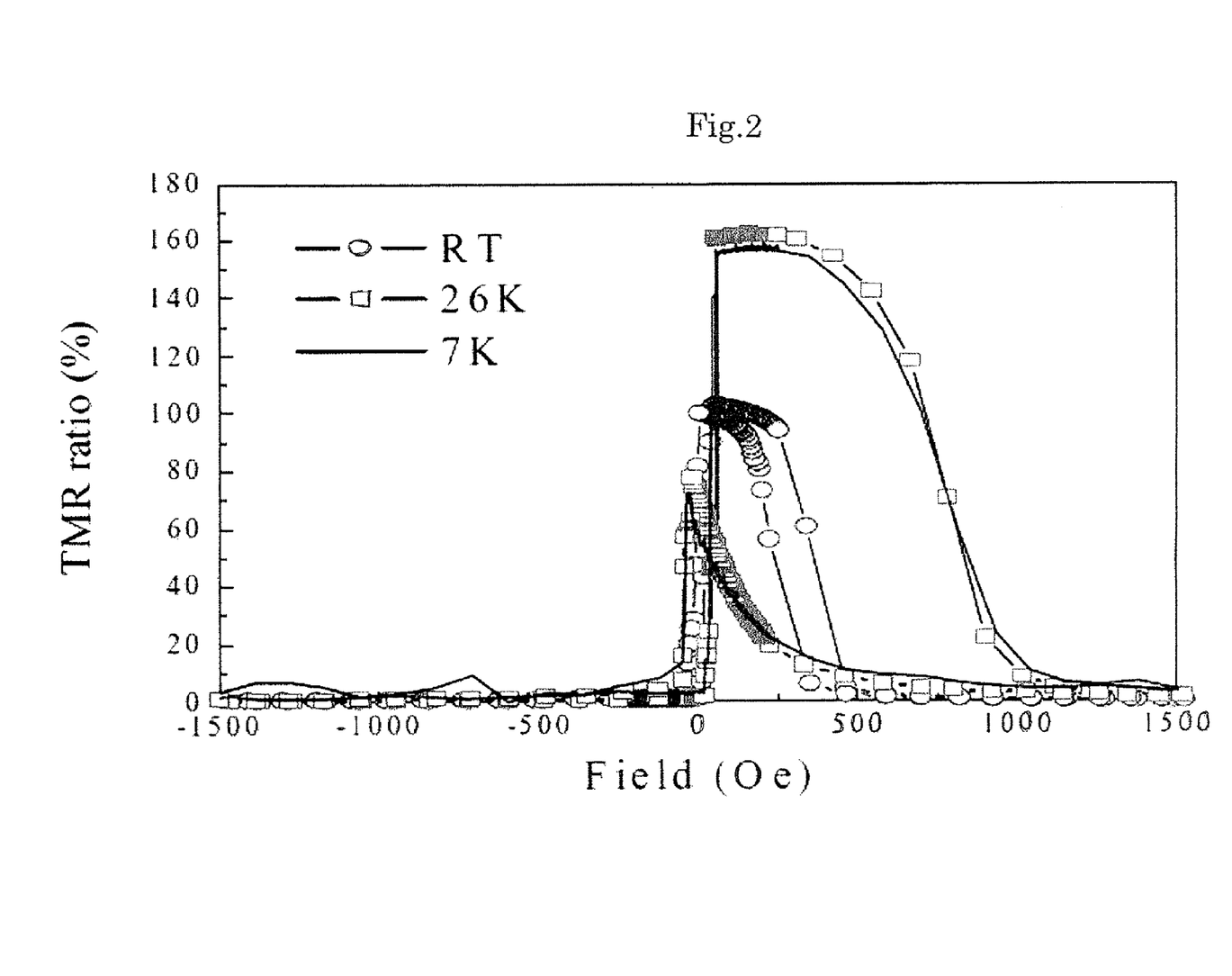
FIG. 2 shows tunnel magnetoresistance (TMR) curves of the tunnel junction of the invention using a CFAS Heusler electrode and a tunnel barrier, as measured at 7 K, 26 K, and room temperature (RT).

Next, the results of the measurement of TMR at 7K, 26 K, and room temperature (RT) are shown in FIG. 2. There were obtained TMRs as very large as 162% at 26 K and 102% at room temperature. A TMR of 162% corresponds to a CFAS spin polarizability of 91%, which is calculated from the formula (1) above using a spin polarizability of 0.5 of the well known CoFe alloy, and which indicates that CFAS is substantially a half-metal.

A TMR of 102% corresponds to a spin polarizability of 75%, which is the highest spin polarizability at room temperature. The reason why such a large TMR value was obtained is presumed that an epitaxial tunnel junction in which the barrier is crystalline and has excellent lattice matching was obtained.

The junction resistance RA is $1.7 \times 10^4$ $\Omega \mu m^2$, which is as small as about two orders of that of the element using an amorphous AlOx barrier. $MgAl_2O_4$ has a lattice constant of 0.808 nm, and has epitaxial-grown while satisfying the CFAS $[100]//MgAl_2O_4$ $[110]$ relationship in the plane of the film. In this instance, the lattice misfit between CFAS and $MgAl_2O_4$ is as very small as 0.7%.

Figure 3:
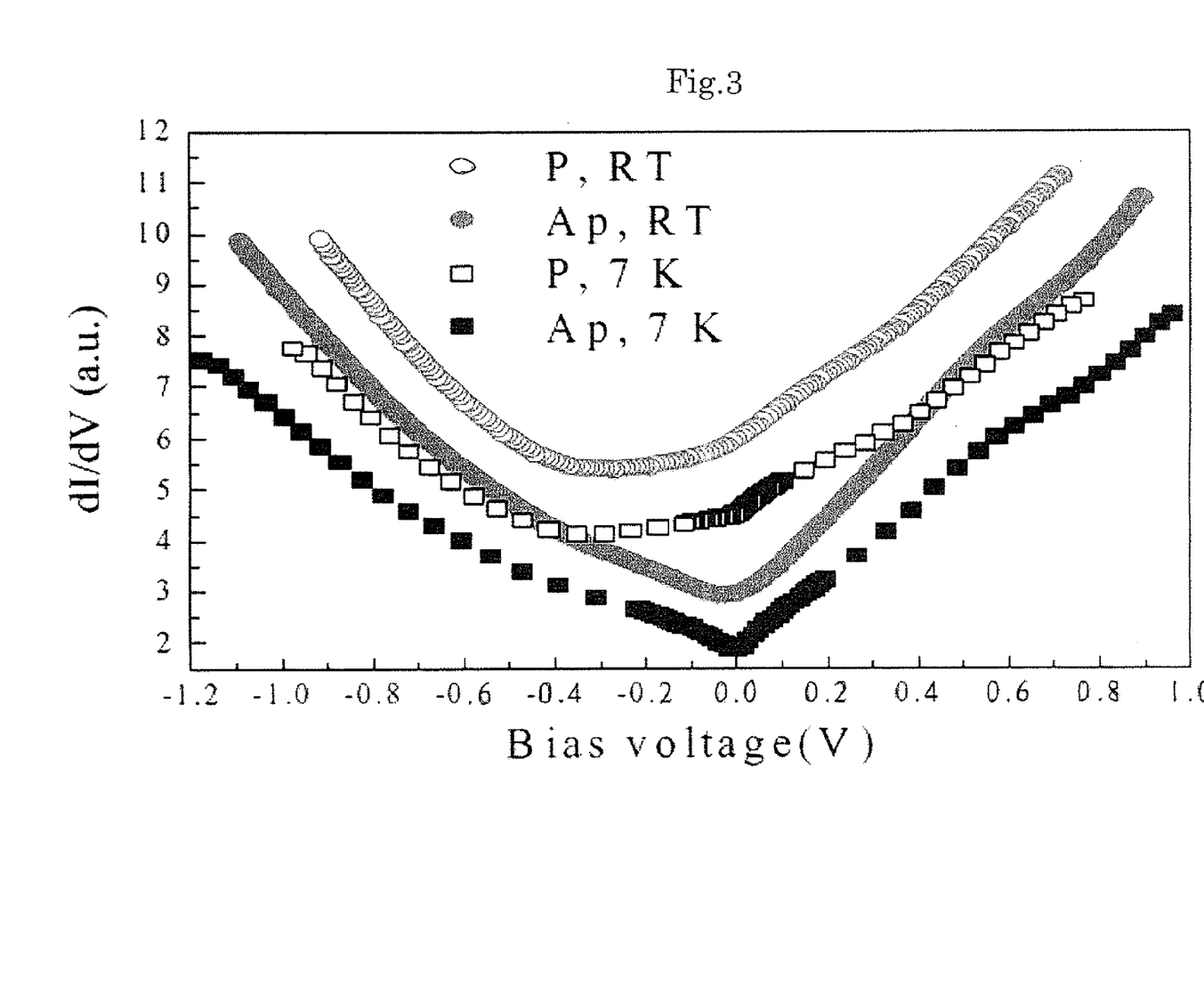
FIG. 3 shows dependence of a differential conductance (dI/dV) on the bias voltage with respect to the tunnel junction of the invention using a CFAS Heusler electrode and a tunnel barrier.
Figure 4:
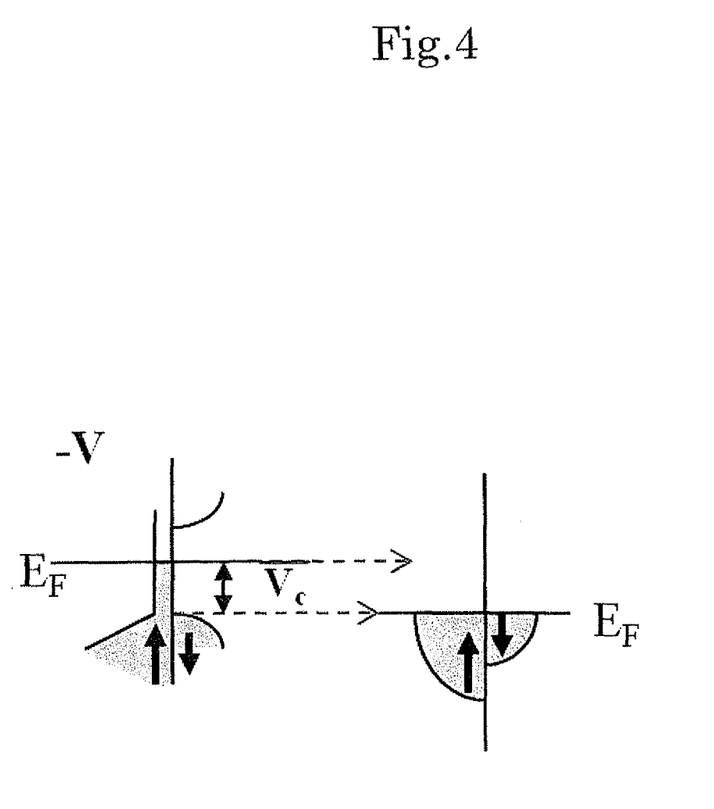
FIG. 4 is a diagram explaining the spin-dependent tunnel in the negative bias region of the tunnel junction of the invention using a CFAS Heusler electrode and a tunnel barrier.

Next, with respect to this element, dependence of a differential conductance G=dI/dV on the bias voltage was measured at room temperature (RT) and 7 K. The results are shown in FIG. 3. The positive bias corresponds to tunneling of electrons from the upper magnetic layer CoFe to the lower magnetic layer CFAS. On the negative bias side, there is a region in which the conductance is almost flat, and the conductance exhibits a weak and minimum value at a certain voltage ($V_c$) and then rapidly increases. This suggests that CFAS is a half-metal (non-patent document 5). $V_c$ values at 7 K and RT are −320 mV and −290 mV, respectively. As diagrammatically shown in FIG. 4, $eV_c$ corresponds to the energy difference between the Fermi level and the top of valence band. It is important that there is a region in which the conductance is almost flat even at room temperature and a half-metal gap is seen (see FIG. 3). Conventionally, such a half-metal gap has not been observed at room temperature, and the above-mentioned result has been obtained for the first time. The reason for this is presumed that CFAS is a half-metal having a large gap and further a $MgAl_2O_4$ barrier which is crystalline and which has excellent lattice matching is formed. The difference 30 mV between $eV_c$ at 7 K and that at room temperature corresponds to heat energy $k_BT=25$ mV.

In the positive voltage, CoFe is not a half-metal, and therefore the spin flips at the CoFe layer interface upon tunneling and thus the spin is not conserved, so that no clear $V_c$ is observed.

Next, with respect to the element and $CoFe/MgAl_2O_4/$CoFe MTJ, the change of a TMR at different temperatures was measured. The spin polarization P obtained from the TMR using the formula (1) could be very appropriately represented by $P=P(0)(1-\alpha T^{3/2})$ using the spin wave theory. P(0) is a spin polarization at 0 K. The fact that the above formula using a single α parameter can be completely fitted to the results of the experiment in the range of from a low temperature to room temperature suggests that enhancement of the TMR due to the coherent tunnel is not found in this MTJ using a $MgAl_2O_4$ barrier. The α values for CFAS and CoFe, respectively, are $2 \times 10^{-5}$ and $3.2 \times 10^{-5}$. The smaller the α value, the more remarkably the TMR at room temperature is improved.

Example 2

A tunnel junction element comprising Cr (40 nm)/CFAS (80 nm)/$MgAl_2O_4$/CFAS (5 nm)/CoFe (3 nm)/IrMn (12 nm)/Ru (7 nm) was prepared using substantially the same method as in Example 1 except that the upper magnetic layer was CFAS instead of the CoFe alloy. The junction resistance RA was $2.2 \times 10^4$ $\Omega \mu m^2$, which was as small as a hundredth of that obtained when using an amorphous AlOx barrier, and the TMR was 240% at room temperature, which was larger than that obtained when using a CoFe alloy in the upper magnetic layer. This indicates that CFAS having a B2 structure is grown epitaxially on the $MgAl_2O_4$ barrier and the resultant CFAS has a spin polarization larger than that of CoFe.

Example 3

A tunnel junction element comprising Cr (40 nm)/CoFe (80 nm)/$MgAl_2O_4$/CFAS (5 nm)/CoFe (3 nm)/IrMn (12 nm)/Ru (7 nm) was prepared using substantially the same method as in Example 1 except that the lower magnetic layer was a CoFe alloy. The TMR at room temperature was 68%, which was equivalent to or more than that of the element using an amorphous AlOx barrier. On the other hand, the junction resistance RA was $1.1 \times 10^4$ $\Omega \mu m^2$, which was reduced to a hundredth of that of the element using an amorphous AlOx barrier. This indicates that the lattice misfit between the CoFe [110] and the $MgAl_2O_4$ [100] is as very small as 0.4% or less and a high-quality epitaxial film has been realized.

Example 4

A tunnel junction element comprising Cr (40 nm)/$Co_2MnSi$ (80 nm)/$MgAl_2O_4$/CoFe (3 nm)/IrMn (12 nm)/Ru (7 nm) was prepared using substantially the same method as in Example 1 except that the lower magnetic layer was a Co-based full Heusler alloy $Co_2MnSi$ instead of the CFAS alloy. It is shown that $Co_2MnSi$ is also a half-metal {non-patent document 5, Y. Sakuraba et al., Appl. Phys. Lett. 88, 192508 (2006)}, and the lattice misfit between $Co_2MnSi$ and $MgAl_2O_4$ is as small as 1.3%. Further, an $L2_1$ structure is obtained. The junction resistance RA is $2.0 \times 10^4$ $\Omega \mu m^2$, which is as small as a hundredth of that obtained when using an amorphous AlOx barrier, and the TMR at room temperature is 96%, which is very high as that of a tunnel junction element having a CoFe upper magnetic layer like Example 1.

Example 5

For examining the feature of the MgAl$_2$O$_4$ barrier, an MTJ having a magnetic Fe layer was prepared.

Using a DC magnetron sputtering apparatus, Cr (40 nm) was deposited as a buffer layer on a MgO (001) substrate, and then for realizing high flatness, the resultant film was subjected to heat treatment at a temperature of 700° C. for one hour. An Fe (30 nm) layer was then formed. Then, for improving the Fe film in crystalline properties, the film was subjected to heat treatment at a temperature of 300° C. for 15 minutes. Subsequently, Mg and Al targets were sputtered to form a Mg (0.91 nm)/Al (1.16 nm) stacked film, and then a Mg—Al oxide film was formed by the same method as in Example 1. The thicknesses of the Mg and Al films were determined so that the stoichiometric composition of MgAl$_2$O$_4$ was substantially realized after the oxidation. Subsequently, for improving the Mg—Al oxide film in film quality and crystalline properties, the resultant film was subjected to heat treatment at a temperature of 500° C. for 15 minutes. An Fe (5 nm) layer was subsequently formed, and then subjected to heat treatment at a temperature of 300° C. for 15 minutes. Further, an IrMn (12 nm)/Ru (7 nm) stacked film was formed at room temperature to prepare a spin valve type tunnel junction. The figure in parentheses indicates a thickness of each film. Next, while applying a magnetic field of 5 kOe, the whole of the stacked film was subjected to heat treatment at a temperature of 200° C. to add uniaxial anisotropy to the upper magnetic Fe layer. The above-mentioned several heat treatment processes and heat treatment temperatures are determined so that the multilayer film is improved in crystalline properties and the Mg—Al oxide film is improved in interface structure.

Then, the above-prepared stacked film was processed into a size of 10 μm×10 μm by microfabrication using photolithography and ion milling. An external magnetic field was applied to the resultant element to measure a TMR.

From the examination under a transmission electron microscope, it has been found that the element is an epitaxial tunnel junction having a MgAl$_2$O$_4$ barrier having a spinel structure and having excellent lattice matching. Further, the use of an X-ray structure analysis has shown that the lattice misfit between the Fe [110] and the MgAl$_2$O$_4$ [100] in the plane of the film is actually as very small as 0.7 to 1.0%.

Figure 5:
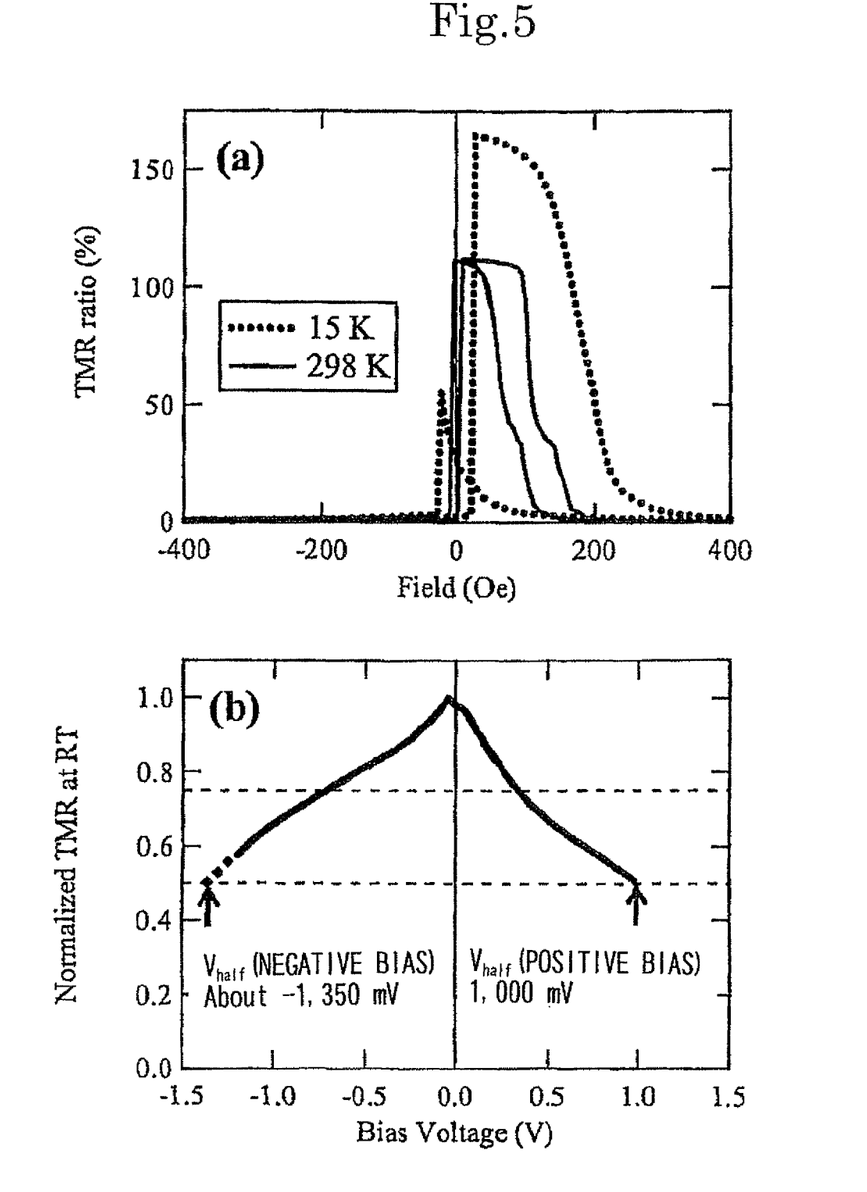
FIG. 5 shows transport characteristics of the tunnel junction of the invention having a tunnel barrier and using an Fe electrode. (a) is TMR curves at 15 K and RT, and (b) shows dependence of a TMR ratio on the bias voltage at room temperature, which is normalized with the TMR at zero bias voltage.

The TMR at 15 K was 165% and the TMR at room temperature was 117%, which were very high values that could not be achieved when using an amorphous AlOx barrier {FIG. 5($a$)}. The junction resistance RA was 2.9×10$^3$ Ωμm$^2$, which was reduced to a hundredth of that obtained when using an amorphous AlOx barrier or less. Further, the TMR dependency on the bias voltage was measured at room temperature. The results are shown in FIG. 5($b$). The positive bias corresponds to tunneling of electrons from the upper magnetic layer Fe to the upper magnetic layer Fe. With respect to the bias voltage ($V_{half}$) at which the TMR is reduced by half, there were obtained values as extremely large as +1,000 mV in the positive bias direction and −1,300 to −1,400 mV in the negative bias direction. An MTJ having a MgO barrier typically has a $V_{half}$ value of about 400 to 750 mV {non-patent document 6: S. Yuasa et al., Nature Mater. 3, 868 (2004)}, and the use of the MgAl$_2$O$_4$ barrier can improve the $V_{half}$ value about 2 times.

The above-mentioned high TMR and excellent TMR dependence on the bias voltage suggest that (1) stabilization of the spinel structure has been achieved by controlling the Mg:Al composition, and further suggest that (2) the heat treatment process conducted during the formation of multilayer film has realized an ideal state such that the interface between the upper or lower magnetic Fe layer and the barrier layer is of extremely high quality and has almost no defect.

A tunnel junction element comprising Cr (40 nm)/Fe (30 nm)/Al$_2$O$_3$/Fe (5 nm)/IrMn (12 nm)/Ru (7 nm) was prepared using substantially the same method as mentioned above except that a spinel analogue structure γ-Al$_2$O$_3$ containing no Mg was used in the tunnel barrier. The obtained Al$_2$O$_3$ layer is in the form of single crystal γ-Al$_2$O$_3$ which is different from the conventional amorphous one. γ-Al$_2$O$_3$ has a lattice constant of 0.791 nm, and has excellent lattice matching with Fe (lattice misfit: 2.3%). On the other hand, the junction resistance RA was 4×10$^3$ Ωμm$^2$, which was reduced to a thousandth of that obtained when using an amorphous barrier.

Example 6

JP-A-2009-54724 discloses, as a spintronics device, a stacked structure having a Heusler alloy and a spin MOS field effect transistor and a tunnel magnetoresistive element each using the stacked structure.

When the tunnel magnetoresistive element formed on the semiconductor substrate/(001)-oriented MgO layer in each of claims 8 and 9 of JP-A-2009-54724 was replaced by the element in each of the above-mentioned Examples 1 to 5, the properties shown in each Example could be exhibited by the resultant device.

TABLE 1

|  |  | Example | | | | |
|---|---|---|---|---|---|---|
|  |  | 1 | 2 | 3 | 4 | 5 |
| Substrate | | MgO(001) | MgO(001) | MgO(001) | MgO(001) | MgO(001) |
| Buffer layer | | Cr(40) | Cr(40) | Cr(40) | Cr(40) | Cr(40) |
| Lower magnetic layer | (nm) | CFAS:B2(80) | CFAS:B2(80) | CoFe(80) | Co$_2$MnSi:L2$_1$(80) | Fe(30) |
| | Lattice constant | 0.568 nm | 0.568 nm | 0.285 nm | 0.565 nm | 0.288 nm |
| | Lattice misfit | 0.7% | 0.7% | 0.4% | 1.3% | 0.7% |
| Barrier layer | (nm) | MgAl$_2$O$_4$(2) | MgAl$_2$O$_4$(2) | MgAl$_2$O$_4$(2) | MgAl$_2$O$_4$(2) | MgAl$_2$O$_4$(2) |
| | Lattice constant | 0.809 nm | 0.809 nm | 0.809 nm | 0.809 nm | 0.82 nm |
| | Lattice misfit | 0.4% | 0.7% | 0.4% | 0.4% | 0.7% |
| Upper magnetic layer | (nm) | CoFe(3) | CFAS:B2(5) | CoFe(3) | CoFe(3) | Fe(5) |
| | Lattice constant | 0.285 nm | 0.568 nm | 0.285 nm | 0.285 nm | 0.288 nm |

TABLE 1-continued

|  | Example | | | | |
|---|---|---|---|---|---|
|  | 1 | 2 | 3 | 4 | 5 |
| Antiferromagnetic layer (nm) | IrMn(12) | IrMn(12) | IrMn(12) | IrMn(12) | IrMn(12) |
| Protective layer (nm) | Ru(7) | Ru(7) | Ru(7) | Ru(7) | Ru(7) |
| TMR  Low temperature | 162% |  |  |  | 165% |
| Room temperature | 102% | 240% | 68% | 96% | 117% |

* (Values) for Examples 1 to 4 indicate theoretical values, and those for Example 5 indicate values obtained from the analysis of the X-ray diffraction and cross-sectional TEM image.

The invention claimed is:

1. A metallic ferromagnetic tunnel junction structure comprising a structure having a tunnel barrier layer disposed between two ferromagnetic layers, wherein the ferromagnetic layers comprise a metal or a metal alloy, and the ferromagnetic layers are directly in contact with the upper and lower interfaces of the tunnel barrier layer, and wherein the tunnel barrier layer is crystalline having an oriented epitaxial structure and an oxidation treatment product of a metal alloy thin film and is a non-magnetic material having a spinel structure.

2. The metallic ferromagnetic tunnel junction structure according to claim 1, wherein the non-magnetic substance is $MgAl_2O_4$.

3. The metallic ferromagnetic tunnel junction structure according to claim 2, wherein at least one of the metallic ferromagnetic layers is a Co-based full Heusler alloy having an $L2_1$ or B2 structure.

4. The metallic ferromagnetic tunnel junction structure according to claim 3, wherein the Co-based full Heusler alloy is $Co_2FeAl_xSi_{1-x}$ ($0 \leq x \leq 1$).

5. The metallic ferromagnetic tunnel junction structure according to claim 1, wherein at least one of the metallic ferromagnetic layers is a Co-based full Heusler alloy having an $L2_1$ or B2 structure.

6. The metallic ferromagnetic tunnel junction structure according to claim 5, wherein the Co-based full Heusler alloy is $Co_2FeAl_xSi_{1-x}$ ($0 \leq x \leq 1$).

7. A magnetoresistive element using a metallic ferromagnetic tunnel junction structure comprising a structure having a tunnel barrier layer disposed between two metallic ferromagnetic layers, wherein the metallic ferromagnetic tunnel junction structure is the metallic ferromagnetic tunnel junction structure according to claim 1.

8. A spintronics device using a metallic ferromagnetic tunnel junction structure comprising a structure having a tunnel barrier layer disposed between two metallic ferromagnetic layers, wherein the metallic ferromagnetic tunnel junction structure is the metallic ferromagnetic tunnel junction structure according to claim 1.

9. A method for producing the metallic ferromagnetic tunnel junction structure according to claim 1, wherein the method comprises forming at least a metallic ferromagnetic layer on a substrate and then, stacking a first pure metal thin film and a second pure metal thin film by sputtering and then subjecting the stacked films to plasma oxidation treatment, or sputtering an alloy of a first pure metal and a second pure metal and subjecting the sputtered alloy to plasma oxidation treatment, to form a tunnel barrier layer which is crystalline having an oriented epitaxial structure and a non-magnetic material having a spinel structure, and further forming a metallic ferromagnetic layer on the tunnel barrier layer.

10. The method for producing the metallic ferromagnetic tunnel junction structure according to claim 9, wherein the layer which is the $MgAl_2O_4$ is formed as the tunnel barrier layer.

11. The method for producing the metallic ferromagnetic tunnel junction structure according to claim 10, wherein at least one of the metallic ferromagnetic layers is formed as a layer which is a Co-based full Heusler alloy having an $L2_1$ or B2 structure.

12. The method for producing the metallic ferromagnetic tunnel junction structure according to claim 11, wherein the layer which is a Co-based full Heusler alloy is $Co_2FeAl_xSi_{1-x}$ ($0 \leq x \leq 1$).

13. The method for producing the metallic ferromagnetic tunnel junction structure according to claim 9, wherein at least one of the metallic ferromagnetic layers is formed as a layer which is a Co-based full Heusler alloy having an $L2_1$ or B2 structure.

14. The method for producing the metallic ferromagnetic tunnel junction structure according to claim 13, wherein the layer which is a Co-based full Heusler alloy is $Co_2FeAl_xSi_{1-x}$ ($0 \leq x \leq 1$).

* * * * *